(12) United States Patent
Suzuki et al.

(10) Patent No.: US 7,830,182 B2
(45) Date of Patent: Nov. 9, 2010

(54) COMPARATOR

(75) Inventors: Masaya Suzuki, Iwata (JP); Yasuomi Tanaka, Hamamatsu (JP); Nobuaki Tsuji, Hamamatsu (JP); Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 112 days.

(21) Appl. No.: 12/284,246

(22) Filed: Sep. 19, 2008

(65) Prior Publication Data
US 2009/0102516 A1   Apr. 23, 2009

(30) Foreign Application Priority Data
Sep. 19, 2007   (JP) .............................. 2007-241789

(51) Int. Cl.
*H03K 5/22* (2006.01)

(52) U.S. Cl. .......................................... 327/77; 327/50

(58) Field of Classification Search .................... 327/50, 327/77
See application file for complete search history.

(56) References Cited

U.S. PATENT DOCUMENTS

| 4,511,810 | A | * | 4/1985 | Yukawa | 327/63 |
| 5,600,280 | A | * | 2/1997 | Zhang | 331/57 |
| 6,894,542 | B2 | * | 5/2005 | Prexl et al. | 327/67 |
| 7,109,761 | B2 | | 9/2006 | Isomura | |
| 7,417,471 | B2 | * | 8/2008 | Gong et al. | 327/50 |

FOREIGN PATENT DOCUMENTS

| JP | S62-127128 | 8/1987 |
| JP | 05-157774 | 6/1993 |
| JP | 07-092203 | 4/1995 |
| JP | 09-105763 | 4/1997 |
| JP | 2000-165213 | 6/2000 |
| JP | 2005-244439 | 9/2005 |
| JP | 2007-142709 | 6/2007 |

OTHER PUBLICATIONS

Japanese Patent Office, Notification of Reason for Refusal of Application No. 2007-241789 (Dispatch Date: Jul. 28, 2009; 3 pgs.).

* cited by examiner

*Primary Examiner*—Hai L Nguyen
(74) *Attorney, Agent, or Firm*—Pillsbury Winthrop Shaw Pittman LLP

(57) ABSTRACT

A comparator has P-channel field effect transistors that are supplied at respective gates with input voltages Vin and Vref, which are objects of comparison, and that act as a differential transistor pair; and N-channel field effect transistors that serve as current channels for respective drain currents of these two P-channel field effect transistors and that act as a current mirror circuit. The comparator outputs a drain voltage Vx of an N-channel field effect transistor as a signal showing a result of comparison between the two input voltages. An N-channel field effect transistor diode-connected to the comparator is interposed between drains of the N-channel field effect transistors.

3 Claims, 3 Drawing Sheets

COMPARATOR

BACKGROUND OF THE INVENTION

The present invention relates to a comparator that compares two input voltages with each other and that outputs a signal corresponding to a result of comparison, and more particularly to a comparator made up of a field effect transistor.

As is well known, a comparator is a circuit that compares two voltages with each other and that outputs a signal showing a result of comparison. Of circuits that compare two voltages by means of a comparator of this type and that process a signal showing a result of comparison, some are designed to process the signal showing a result of comparison at a source voltage that is lower than two voltages to be compared for reasons of; for example, an attempt to save power consumed by an entire circuit. FIGS. 3A and 3B show such circuit configurations, respectively.

In a circuit shown in FIG. 3A, voltages A and B, which are objects of comparison, are delivered to source follower circuits 40a and 40b, respectively. The source follower circuit 40a is made up of a voltage dividing circuit including an N-channel field effect transistor 41a whose drain is connected to the power source and whose gate is provided with the voltage A and resistors 42a and 43a interposed between a source of the N-channel field effect transistor 41a and an earth. The source follower circuit 40b is also made up of an N-channel field effect transistor 41b and resistors 42b and 43b, which exhibit a similar relationship of connection. A source voltage PVDD applied to the source follower circuits 40a and 40b must be a voltage that surpasses at least the upper limits of the voltages A and B serving as objects of comparison. A comparator 50 and subsequent circuits, which are at a stage subsequent to the source follower circuits 40a and 40b, are provided with a source voltage AVDD that is lower than the source voltage PVDD supplied to the source follower circuits 40a and 40b. In this configuration, the source follower circuit 40a (40b) applies the input voltage A (B) to the voltage dividing circuit made up of the resistors 42a and 43a (the resistors 42b and 43b), to thus divide the voltage, and voltages va and vb, into which the input voltage A (B) is compressed, are applied to the comparator 50. The comparator 50 compares the thus-compressed voltages va and vb with each other. As mentioned above, the circuit configuration utilizing the source follower circuit is described in; for instance, JP-A-2007-142709.

In the circuit shown in FIG. 3B, a comparator 60 disposed at a preceding stage is provided with the source voltage PVDD that surpasses at least the upper limits of the voltages A and B serving as objects of comparison. A circuit subsequent to a level shift circuit 70 is supplied with the source voltage AVDD that is lower than the source voltage PVDD supplied to the comparator 60. Both source voltages are supplied to the level shift circuit 70. In accordance with a result of comparison between the voltages A and B, the comparator 60 outputs a signal Vx of 0 volt or having a level in the vicinity of the source voltage supplied to the comparator 60. The level shift circuit 70 poses a limitation on the level of the signal Vx output from the comparator 60; converts the signal into a signal Vout whose upper limit is equal to the source voltage AVDD applied to the circuit subsequent to the level shift circuit 70; and supplies the thus-converted signal to the subsequent circuit.

However, in the circuit shown in FIG. 3A, when the source voltage supplied to the source follower circuits 40a and 40b decrease, a potential difference va-vb of each of the output signals is compressed. When the potential difference va-vb is compressed as mentioned above, operation of the comparator 50 becomes unstable, so that an electronic circuit on a subsequent stage cannot be operated properly. In the circuit shown in FIG. 3A, the comparator 50 compares the compressed voltages va and vb with each other, and hence there arises a problem of the voltages being vulnerable to external noise. As shown in FIG. 3C, in the circuit shown in FIG. 3B, the signal Vx output from the comparator 60 changes in a range from 0 volt to the source voltage PVDD of the comparator 60. Accordingly, when the signal Vx output from the comparator 60 falls, a time is consumed before the output signal Vx falls from the source voltage PVDD to a threshold value of the level shift circuit 70. Hence, inversion of the level of the signal Vout output from the level shift circuit 70 is delayed, which raises a problem of an overall delay time for the comparator 60 and the level shift circuit 70 becoming longer.

SUMMARY OF THE INVENTION

The present invention has been conceived in view of the circumstance and aims at providing a comparator that compares two large voltages, which are objects of comparison, just as they are; that can output a signal of low voltage, which can be processed by a circuit provided on a subsequent stage, as a signal showing a result of comparison; and that involves a short delay time before production of an output.

In order to solve the problem, the present invention provides a comparator comprising:

first and second field effect transistors which respectively include sources connected commonly with each other and gates to which first and second input voltages are supplied respectively;

a constant current source interposed between a common node connected between the sources of the first and second field effect transistors and a first power source;

third and fourth field effect transistors which respectively include sources connected to a second power source that differs in voltage from the first power source, gates connected to a drain of the first field effect transistor, and drains connected to respective drains of the first and second field effect transistors; and a fifth field effect transistor which includes a source connected to a gate and a drain of the third field effect transistor, a drain connected to a node connected between the respective drains of the second and fourth field effect transistors, and a gate connected to the node, wherein a voltage of a node connected between the respective drains of the second and fourth field effect transistors is output as a signal showing a result of comparison between the first and second input voltages.

Further according to the invention, preferably, the voltage of the node between the respective drains of the second and fourth field effect transistors does not exceed a value obtained by the following expression:

$$V_{3t} + \Delta_3 ov + V_{5t} + \Delta_5 ov$$

where $V_{3t}$ represents threshold values of the third transistor, $\Delta_3 ov$ represents overdrive voltages of the third transistor, $V_{5t}$ represents threshold values of the fifth transistor and $\Delta_5 ov$ represents overdrive voltages of the fifth transistor.

According to the comparator of the present invention, when the signal showing the result of comparison rises and attempts to surpass a voltage achieved in the vicinity of a sum of a threshold value of the fifth field effect transistor and a threshold value of the third field effect transistor, both the fifth and third field effect transistors are turned on, thereby acting as a limiter for limiting an increase in the voltage of the signal showing the result of comparison. Therefore, the comparator outputs, as the signal showing the result of comparison, a signal whose amplitude is smaller than the source voltage for the comparator. In addition, the comparator of the present invention outputs a signal whose amplitude is smaller than the source voltage. Hence, a necessity for provision of a level shift circuit is obviated, and a delay time achieved before production of an output becomes shorter than that achieved in the related art.

DETAILED DESCRIPTION OF PREFERRED EMBODIMENTS

An embodiment of the present invention will be described hereunder by reference to the drawings.

Figure 1:
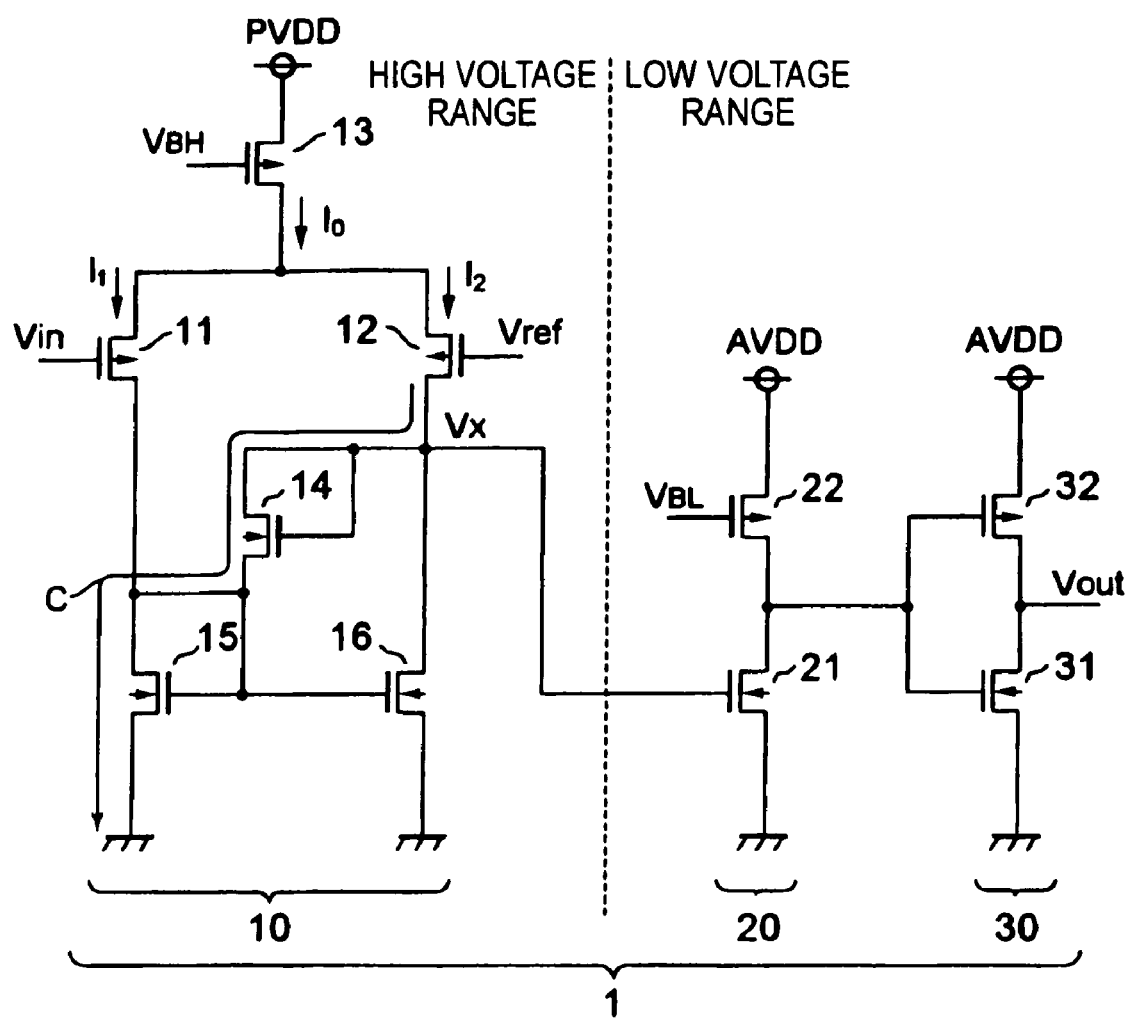
FIG. 1 is an example circuit configuration of an electronic circuit 1 including a comparator 10 of an embodiment of the present invention.

FIG. 1 is a block diagram showing an example configuration of an electronic circuit 1 including a comparator 10 of an embodiment of the present invention. The electronic circuit 1 includes a high-voltage-range circuit that operates at a high source voltage (PVDD) and a low-voltage-range circuit that operates at a low source voltage (AVDD: AVDD<PVDD). As shown in FIG. 1, the high-voltage-range electronic circuit in the electronic circuit 1 includes the comparator 10, and the low-voltage-range electronic circuit includes a source-grounded amplifying circuit 20 and an inverter 30. This electronic circuit 1 is characterized in that the comparator 10 that compares an input voltage Vin with a comparison voltage Vref and that outputs a signal showing a result of comparison is configured in such a way that a voltage level of a signal Vx output from the comparator is limited to a low voltage of the order of magnitude which can be received and processed by a low-voltage-range circuit on a subsequent stage.

In the comparator 10, sources of respective P-channel field effect transistors 11 and 12 are connected commonly, and voltages Vin and Vref, which are objects of comparison, are applied to gates of the respective transistors. The P-channel field effect transistors 11 and 12 shown in FIG. 1 have the same transistor size (channel width) and constitute a differential transistor pair. A P-channel field effect transistor 13 whose gate is supplied with a given voltage $V_{BH}$ and which acts as a constant current source is interposed between a first power source that generates the source voltage PVDD and a common node between the respective sources of the P-channel field effect transistors 11 and 12. A drain current Io of the P-channel field effect transistor 13 is split between the P-channel field effect transistors 11 and 12. The essential requirement for the gate voltage $V_{BH}$ of the P-channel field effect transistor 13 is to be determined appropriately in accordance with the transistor size of the P-channel field effect transistors 11 and 12. Sources of respective N-channel field effect transistors 15 and 16 are connected to a second power source (a ground in the present embodiment) whose voltage differs from that of the first power source; respective drains are connected to the respective drains of the P-channel field effect transistors 11 and 12; and a drain voltage of the P-channel field effect transistor 11 is applied as a gate voltage to respective gates of the N-channel field effect transistors 15 and 16. The N-channel field effect transistors 15 and 16 have the same transistor size and constitute a current mirror circuit.

As shown in FIG. 1, the comparator 10 additionally has an N-channel field effect transistor 14. A source of the N-channel field effect transistor 14 is connected to a drain of the N-channel field effect transistor 15. The gate and drain of the N-channel field effect transistor 14 are (subjected to; i.e., diode connection) connected to a node between the drain of the P-channel field effect transistor 12 and the drain of the N-channel field effect transistor 16. Although details of the connection will be provided later, a characteristic of the comparator 10 of the present embodiment Ties in provision of the N-channel field effect transistor 14.

A source-grounded amplifying circuit 20 is made up of an N-channel field effect transistor 21 and a P-channel field effect transistor 22. A source of the N-channel field effect transistor 21 is connected to a ground, and the drain voltage Vx of the P-channel field effect transistor 12 in the comparator 10 is applied to a gate of the N-channel field effect transistor 21. The P-channel field effect transistor 22 is interposed between a power source that generates a source voltage AVDD and the N-channel field effect transistor 21. A constant voltage Vat is applied to a gate of the P-channel field effect transistor 22, and the transistor acts as a constant current source that supplies a drain current to the N-channel field effect transistor 21. In the source-grounded amplifying circuit 20, a voltage of a node connected between a drain of the N-channel field effect transistor 21 and a drain of the P-channel field effect transistor is output as an output signal to an inverter circuit 30. The essential requirement for the gate voltage $V_{BL}$ of the P-channel field effect transistor 22 is to be determined, as appropriate, in accordance with the transistor size of the N-channel field effect transistor 21.

The inverter circuit 30 is made by series connection of a P-channel field effect transistor 32 and an N-channel field effect transistor 31, whose gates are supplied with a signal output from the source-grounded amplifying circuit 20, between the source that generates the source voltage AVDD and a ground. A drain of the P-channel field effect transistor 32 and a drain of the N-channel field effect transistor 31 are commonly connected, and a voltage of the common node is output as an output signal Vout to an electronic circuit on a subsequent stage.

The above relates to the configuration of the electronic circuit 1.

Operation of the electronic circuit 1 will now be described by reference to the drawings.

Figure 2:
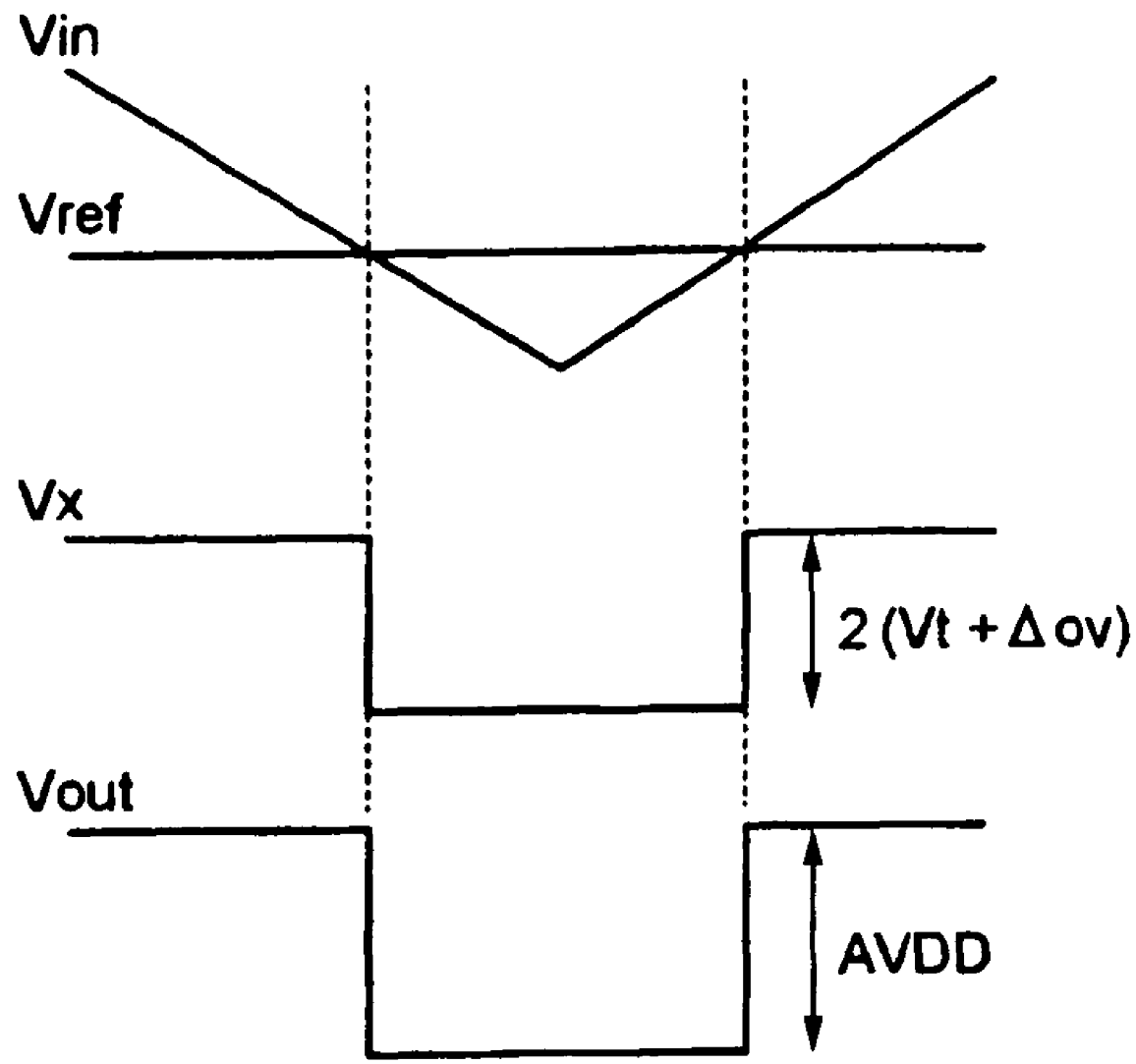
FIG. 2 is a view for describing operation of the electronic circuit 1.
Figure 3A:
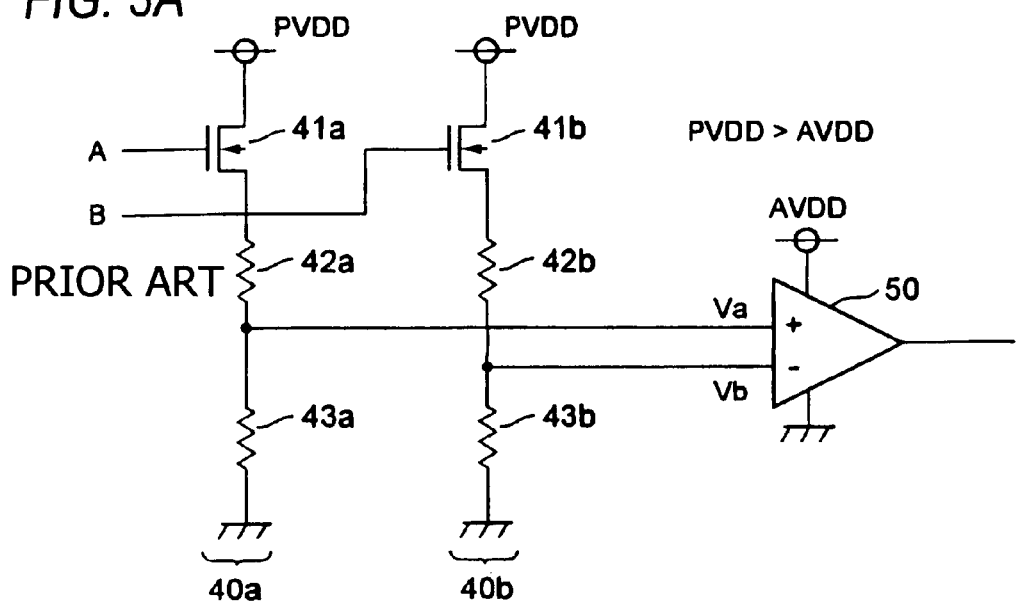
FIGS. 3A, 3B and 3C are views showing a related-art circuit and its example operation for causing an electronic circuit that processes a signal showing a result of comparison to operate at a source voltage which is lower than two voltages to be compared.
Figure 3B:
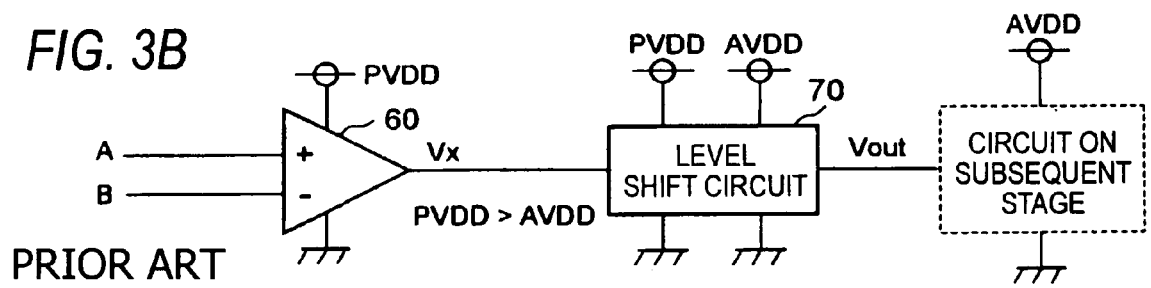
Figure 3C:
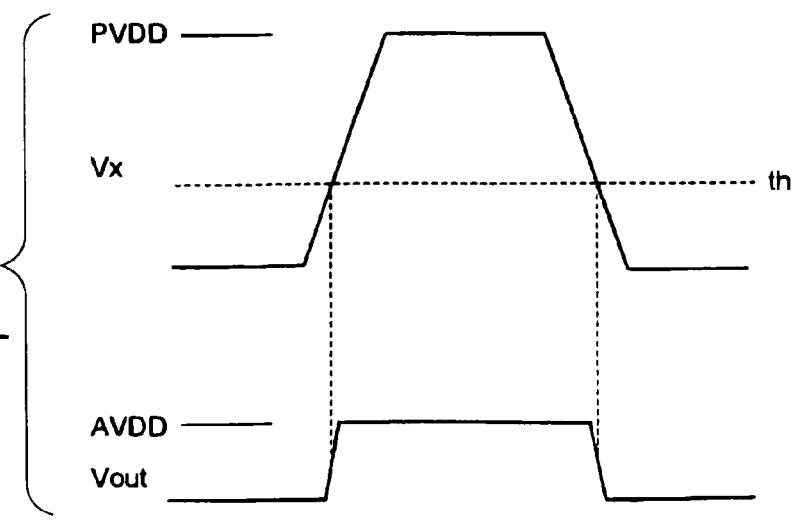

FIG. 2 shows the manner of changes in the signal Vx output from the comparator 10 and the signal Vout output from the inverter circuit 30 when an input voltage Vin changes so as to cross the comparison voltage Vref in the electronic circuit 1. In FIG. 2, when the input voltage Vin is lower than the comparison voltage Vref for reference purpose, a gate-source voltage applied to the P-channel field effect transistor 11 becomes greater than a gate-source voltage applied to the P-channel field effect transistor 12. Hence, the majority of the drain current Io output from the P-channel field effect transistor 13 serving as a constant current source turns into a drain current $I_1$ and flows into the P-channel field effect transistor 11. In this state, the drain voltage of the N-channel field effect transistor 15 becomes high, and the drain voltage (i.e., Vx) of the N-channel field effect transistor 16 becomes low, whereupon the N-channel field effect transistor 21 of the source-grounded amplifying circuit 20 is turned off. Consequently, a signal output from the source-grounded amplifying circuit 20 comes to a high level, and a signal output from the inverter circuit 30 on a subsequent stage comes to a low level.

However, when the input voltage Vin increases so as to cross the comparison voltage Vref, the relationship of magnitude between the gate-source voltage applied to the P-channel field effect transistor 12 and the gate-source voltage applied to the P-channel field effect transistor 11 is inverted. Of the drain current Io output from the P-channel field effect transistor 13, the electric current $I_1$ flowing into the P-channel field effect transistor 11 decreases, whilst a current $I_2$ flowing into the P-channel field effect transistor 12 increases.

In a state where the input voltage Vin is higher than the comparison voltage Vref for reference purpose, the majority of the drain current Io output from the P-channel field effect transistor 13 serving as a constant current source turns into a drain current $I_2$ and flows into the P-channel field effect transistor 12. In this state, the drain voltage of the N-channel field effect transistor 16 becomes high, and the N-channel field effect transistor 21 of the source-grounded amplifying circuit 20 is turned on. Consequently, the signal output from the source-grounded amplifying circuit 20 comes into a low level, whereas the signal output from the inverter circuit 30 on a subsequent stage comes into a high level.

What deserves notice is the drain voltage Vx of the N-channel field effect transistor 16 being limited to a low voltage as a result of the comparator 10 being provided with the N-channel field effect transistor 14 as shown in FIG. 1. More specifically, when the drain voltage Vx of the N-channel field effect transistor 16 reaches a voltage achieved in the vicinity of a sum of the threshold value of the N-channel field effect transistor 14 and the threshold value of the N-channel field effect transistor 15 [e.g., $2\times(V_t+\Delta ov)$ in a case where the threshold values of both transistors are $V_t$ and where overdrive voltages of both transistors are $\Delta ov$], an electric current flows into a current channel C leading to a ground by way of the N-channel field effect transistors 14 and 15 as shown in FIG. 1. Therefore, the drain voltage Vx of the N-channel field effect transistor 16 does not surpass the voltage achieved in the vicinity of the sum of the threshold value of the N-channel field effect transistor 14 and the threshold value of the N-channel field effect transistor 15. In short, the N-channel field effect transistors 14 and 15 act as an output voltage limiter circuit. Conversely, it is manifest from the descriptions that, when the input voltage Vin falls so as to cross the comparison voltage Vref for reference purpose, the voltage Vx output from the comparator 10 falls below the voltage achieved in the vicinity of the sum of the threshold value of the N-channel field effect transistor 14 and the threshold value of the N-channel field effect transistor 15.

Needless to say, in the case that the threshold values of transistors are different from each other and overdrive voltages of both transistors are different from each other, the vicinity of a sum of the threshold value of the N-channel field effect transistor 14 and the threshold value of the N-channel field effect transistor 15 are expressed by the sum of the threshold values of transistors and the overdrive voltages of both transistors which are different from each other.

As mentioned above, in the electronic circuit 1 of the present embodiment, the voltage Vx output from the comparator 10 does not cause a full swing from the ground potential to the source voltage PVDD. Even when the input voltage Vin falls so as to cross the comparison voltage Vref (i.e., when the signal Vx output from the comparator 10 changes from a high level to a low level), the delay time of the entire electronic circuit 1 does not become long. Further, in the electronic circuit 1 of the present embodiment, the upper limit of the signal Vx output from the comparator 10 is limited to the voltage achieved in the vicinity of the sum of the threshold value of the N-channel field effect transistor 14 and the threshold value of the N-channel field effect transistor 15. Hence, direct application of the output signal Vx to the field-effect transistor that operates in a low voltage range becomes possible, and provision of the foregoing level shift circuit is also obviated. In addition, in the comparator 10 of the present embodiment, the voltage of the signal output from the comparator 10 can be limited to a low level by utilization of the N-channel field effect transistor 15 constituting a current mirror circuit. Hence, the voltage of the output signal can be limited by means of a smaller number of transistors.

The embodiment of the present invention has been described above. However, other various embodiments of the present invention are also conceivable. For instance, in the embodiment, the comparator that operates in a high voltage range is embodied by the configuration in which the differential transistor pair is made up a of the P-channel field effect transistors; in which the P-channel field effect transistor serving as the constant current source is interposed between the first power source (the power source that generates the source voltage PVDD in the embodiment) and the differential transistor pair; in which the current mirror circuit made up of the N-channel field effect transistors is interposed between the second power source (the ground in the embodiment) differing from the first power source and the differential transistor pair; and in which there is included the N-channel field effect transistor constituting the output voltage limiter circuit along with one of the N-channel field effect transistors of the current mirror circuit. However, in addition to being embodied by the configuration, the comparator is also embodied by a configuration in which a differential transistor pair is made up of N-channel field effect transistors; in which an N-channel field effect transistor serving as a constant current source is interposed between the differential transistor pair and the first power source (e.g., a ground); in which a current mirror circuit made up of P-channel field effect transistors is interposed between the second power source (e.g., the power source that generates the source voltage PVDD) differing in voltage from the first power source and the differential transistor pair; and in which there is included a P-channel field effect transistor constituting an output voltage limiter circuit along with one of the P-channel field effect transistors constituting the current mirror circuit.

What is claimed is:

1. An electronic circuit comprising:
   a first circuit which operates at a first difference voltage between a first voltage of a first power source and a second voltage of a second power source, the second voltage being different from the first voltage; and
   a source-grounded amplifying circuit which operates at a second difference voltage between the second voltage of the second power source and a third voltage of a third power source, the third voltage being lower than the first voltage, and wherein the source-grounded amplifying circuit is coupled to an output of the first circuit,
   the first circuit providing a comparator function and including:
   first and second field effect transistors which respectively include sources connected commonly with each other and gates to which first and second input voltages are supplied respectively;

a constant current source interposed between a common node connected between the sources of the first and second field effect transistors and the first power source;

third and fourth field effect transistors which respectively include sources connected to the second power source, gates connected to a drain of the first field effect transistor, and drains connected to respective drains of the first and second field effect transistors; and a fifth field effect transistor which includes a source connected to a gate and a drain of the third field effect transistor, a drain connected to a node connected between the respective drains of the second and fourth field effect transistors, and a gate connected to the node, wherein a voltage of the node connected between the respective drains of the second and fourth field effect transistors is output to the source-grounded amplifying circuit as a signal showing a result of comparison between the first and second input voltages.

2. The electronic circuit according to claim 1, wherein the voltage of the node connected between the respective drains of the second and fourth field effect transistors does not exceed a value obtained by the following expression:

$$V_{3t}+\Delta_3 ov+V_{5t}+\Delta_5 ov$$

where $V_{3t}$ represents threshold values of the third field effect transistor, $\Delta_3 ov$ represents overdrive voltages of the third field effect transistor, $V_{5t}$ represents threshold values of the fifth field effect transistor and $\Delta_5 ov$ represents overdrive voltages of the fifth field effect transistor.

3. The electronic circuit according to claim 1, wherein the source-grounded amplifying circuit includes:

a sixth field effect transistor which includes a source connected to the second power source; and a second constant current source interposed between a drain of the sixth field effect transistor and the third power source; and wherein the signal showing the result of comparison is applied to a gate of the sixth field effect transistor.

* * * * *